United States Patent

Nakanishi et al.

[11] Patent Number: 5,110,664
[45] Date of Patent: May 5, 1992

[54] THICK FILM AND THIN FILM COMPOSITE SUBSTRATE AND ELECTRONIC CIRCUIT APPARATUS USING IT

[75] Inventors: Keiichirou Nakanishi, Kokubunji; Masakazu Yamamoto, Hadano; Minoru Yamada, Hanno, all of Japan

[73] Assignee: Hitachi, Ltd., Tokyo, Japan

[21] Appl. No.: 550,553

[22] Filed: Jul. 10, 1990

[30] Foreign Application Priority Data

Jul. 10, 1989 [JP] Japan ................. 1-175464

[51] Int. Cl.⁵ .................... B32B 3/00; B32B 27/14
[52] U.S. Cl. .................... 428/195; 428/137; 428/209; 428/433; 428/473.5; 428/901; 361/397; 361/414; 174/255; 174/256
[58] Field of Search ............... 428/901, 209, 137, 433, 428/473.5, 195; 361/397, 414; 29/830; 174/250, 255, 256, 258

[56] References Cited

U.S. PATENT DOCUMENTS

| | | | |
|---|---|---|---|
| 4,407,007 | 9/1983 | Desai | 174/257 |
| 4,665,468 | 5/1987 | Dohya | 174/258 |
| 4,672,152 | 6/1987 | Shinohara | 174/258 |
| 4,685,033 | 8/1987 | Inoue | 174/258 |
| 4,706,164 | 11/1987 | Takenaka | 361/414 |
| 4,754,371 | 6/1988 | Nitta | 174/256 |
| 4,816,323 | 3/1989 | Inoue | 428/137 |
| 4,922,377 | 5/1990 | Matsumoto | 361/414 |

FOREIGN PATENT DOCUMENTS

| | | |
|---|---|---|
| 183956 | 8/1986 | Japan . |
| 1-33390 | 5/1989 | Japan . |
| 1-94393 | 8/1989 | Japan . |

OTHER PUBLICATIONS

Y. Murano, "Water Cooling the Multichip Package", Nikkei Electronics, 1985 (Jun. 17), Nikkei Business Publications, Inc., pp. 243-266.

Primary Examiner—Ellis P. Robinson
Assistant Examiner—Nasser Ahmad
Attorney, Agent, or Firm—Antonelli, Terry, Stout & Kraus

[57] ABSTRACT

A thick film and thin film composite wiring substrate for mounting integrated circuit chips thereon, comprising a thin film substrate including a signal wiring layer therein, a thick film substrate laminated together with the thin film substrate, and at least a part of signal wiring being formed as a signal wiring layer included in the thick film substrate.

32 Claims, 9 Drawing Sheets

YIELD PER LAYER WITH α = 0.7

THE NUMBER n OF THIN FILM LAYERS

5,110,664

THICK FILM AND THIN FILM COMPOSITE SUBSTRATE AND ELECTRONIC CIRCUIT APPARATUS USING IT

BACKGROUND OF THE INVENTION

The present invention relates to a wiring substrate having a plurality of integrated circuit chips mounted thereon and interconnecting input and output signals of the integrated circuit chips and an electronic circuit apparatus using the wiring substrate, and in particular to a wiring substrate suitable for a large-sized logical unit such as a computer requested to have a higher signal propagation speed and an electronic circuit apparatus using such a wiring substrate.

For raising the operation speed in computers or the like, it is necessary to not only raise the operation speed of integrated circuits but also shorten signal propagation delay time within a wiring substrate having a plurality of integrated circuit chips mounted thereon and interconnecting input and output signals of respective integrated circuit chips.

For this purposes, there is a necessity for a wiring substrate capable of having integrated circuit chips mounted with high density thereon, causing short propagation delay times inside thereof, and having small parasitic capacitance and inductance values of signal lead wiring or spread wiring extending from integrated circuit chips to through-holes and of through-holes themselves.

One of wiring substrates having such characteristics is a ceramic multilayer interconnection substrate shown in FIG. 7 of Nikkei Electronics, June 17, 1785, p. 251. In this wiring substrate, a fine signal wiring layer is formed on the surface of an alumina ceramic substrate having a power supply and ground layer by applying a thin-film process such as photolithography to polyimide resin. Owing to a lowered dielectric constant resulting from application of polyimide resin and a higher wiring density and a shortened through-hole length resulting from application of a thin film process, the above described characteristics demanded of wiring substrates are effectively realized.

At the present time, higher integration and capability of handling larger power are sought in integrated circuit chips for large computers, and integrated circuit chips of an integration class having 10,000 gates are put into practical use. For mounting chips of high integration on a wiring substrate, a large number of signal wiring layers must be formed on a large-sized substrate even if the above described substrate using thin film wiring is used.

If the wiring substrate is increased in size, wiring running in the wiring layer becomes longer and voltage drop caused by direct current resistance has a value which cannot be neglected. To improve this, the thickness of signal wiring must be made larger. However, it takes an enormously long process time to form thick wiring by using the thin film process. Therefore, it becomes disadvantageous as regards the cost to form a wiring layer by using the thin film process entirely as the number of wiring layers is increased and the substrate size is made large.

If in this case a signal wiring layer is formed by a thick film wiring process in the portion of a ceramic substrate existing in the lower portion of the thin film wiring layer, a wiring substrate can be formed at a low cost. In one method of the thick film wiring process, a conductor layer is formed on a sheet comprising a ceramic material, for example, by screen printing and then this is sintered to form thick film wiring. However, the signal wiring layer in the ceramic substrate is larger in dielectric constant than a signal wiring layer formed by applying a thin film wiring process to an organic insulation layer such as polyimide resin or an inorganic insulation layer such as $SiO_2$, and it is not easy to form wiring and through-holes minutely.

SUMMARY OF THE INVENTION

An object of the present invention is to provide a thick film and thin film composite substrate comprising a combination of a thin film wiring layer having favorable signal transmission characteristics and a thick film wiring layer of a low cost without causing reduction of signal propagation speed and an electronic circuit apparatus using such a composite substrate.

Firstly in accordance with a feature of the present invention, signal wiring needing high speed propagation is disposed in a thin film wiring layer of a thick film and thin film composite substrate, whereas signal wiring which does not need so high speed propagation is disposed in a thick film wiring layer. Especially, signal wiring for clock signal distribution and signal wiring for inspection and maintenance of integrated circuit chips can be disposed in the thick film wiring layer.

Secondly, as for connection between the thick film wiring layer and the thin film wiring layer, a wiring layer exclusively used for connection between the thick film wiring layer and the thin film wiring layer is so disposed in the bottom layer of the thin film wiring layer that an arbitrary signal through-hole of the thin film wiring layer may be connected to an arbitrary signal through-hole of the thick film wiring layer, and only wiring which must be connected to the thick film wiring layer is connected by using this wiring layer for the exclusive use. Especially, the object can be achieved more effectively by returning wiring, which is once connected from an integrated circuit chip to a test pad disposed around the integrated circuit chip, to a through-hole of the thick film wiring layer located under the integrated circuit chip by means of the above described wiring layer for exclusive use.

More preferably, a signal wiring pattern and a power supply wiring pattern are so mixedly formed in the above described wiring layer for exclusive use that the width of the power supply wiring pattern may be wider than the width of the signal wiring pattern, or the wiring path in the wiring layer for exclusive use is not limited to one kind, but automatic wiring is performed by computer processing depending upon the kind and the number of integrated circuit chips which are mounted.

Thirdly, by disposing a signal through-hole of the thin film wiring layer right above a signal through-hole of the thick film wiring layer and directly connecting them, connection between the thick film wiring layer and the thin film wiring layer can be accomplished more effectively. More preferably, the lattice pitch of the thin film wiring layer is so set as to be an integer times the lattice pitch of the thin film wiring layer.

In accordance with a fourth feature of the present invention, the cross section of signal wiring is so set that the direct current resistance value of wiring having the greatest length and included in signal wiring existing within the thin film substrate may not exceed one tenth of the characteristic impedance value of the signal wiring.

In accordance with a fifth feature of the present invention, each layer of the signal wiring layer located within the thin film substrate comprises two layers, i.e., a normal layer for signal wiring and a signal wiring layer for testing.

In accordance with a sixth feature of the present invention, through-holes included within the thin film substrate are arranged in a lattice form with a pitch equivalent to an integer times the lattice pitch of the thin film substrate.

In accordance with a seventh feature of the present invention, the characteristic impedance value of the thick film signal wiring layer located within the thick film substrate is so set as to be equivalent to the characteristic impedance value of the thin film signal wiring layer located within the thin film substrate.

In accordance with an eighth feature of the present invention, resistor elements for terminating integrated circuit chips are so disposed in a layer located right under a test pad on the surface of the thin film substrate that these resistor elements may be connected to the test pad via partially-through-holes or blind holes. In this case, the object can be achieved more effectively by disposing a power supply wiring layer for supplying power to the above described resistor elements with the exception of right under the boundary areas between integrated circuit chips and the test pad. A blind hole does not extend onto both surfaces of a substrate.

In accordance with a ninth feature of the present invention, the above described resistor element is formed under a boundary area between the test pad and the integrated circuit chip, and a wiring layer exclusively used for connecting the test pad to the resistor element is formed.

In accordance with a tenth feature of the present invention, a plurality of through-holes formed within the thick film substrate are connected to a pad, whereto an input pin for power supply should be attached, included in pads for attachment of input and output pins existing on the rear face of the thick film substrate, and one through-hole located within the thick film substrate is connected to pads whereto input and output pins for supplying signals are connected.

Eleventhly, the thick film and thin film composite substrate heretofore described is used as the wiring substrate, and a plurality of integrated circuit chips are mounted on the wiring substrate to realize an electronic circuit apparatus which is excellent in signal transmission characteristics. At this time, signal wiring for transmitting signals whose delays do not affect the response speed of the electronic circuit apparatus is disposed preferentially within the thick film substrate. It is more effective in case integrated circuit chips comprise ECL circuits.

In accordance with the feature of the present invention, signal wiring is classified into that needing high speed propagation and that which does not need high speed propagation, and the signal wiring needing high speed propagation is disposed in a thin film wiring layer and the signal wiring which does not need so high speed propagation is disposed in a thick film wiring layer. That is, to say, logic signals used in a computer or the like comprise two kinds of signals, i.e., signals which must be propagated as quickly as possible because the processing speed of the computer depends upon the propagation time of those signals and signals which need not be propagated so quickly because the propagation time leaves a margin in comparison with the first mentioned signals. By disposing the signal wiring needing high-speed propagation in a thin film wiring layer and disposing the signal wiring which does not need signal propagation at so high speed in a thick film wiring layer, therefore, the processing speed of the computer depends only upon the delay time of the thin film wiring layer and the delay time caused in the thick film signal wiring, which has been introduced for cost improvement, does not affect the processing speed of the computer. As logic signals which do not need to be propagated at so high speed and which bring about an effect when disposed in the thick film wiring layer, signals for supplying clocks and signals for inspection and maintenance of integrated circuit chips can be mentioned.

The present invention provides a thick film and thin film composite substrate by combining a thin film wiring layer having favorable signal transmission characteristics and a thick film wiring layer of low cost without lowering the signal propagation speed.

Secondly, a wiring layer used exclusively for interconnection between the thin film wiring layer and the thick film wiring layer is used, and hence arbitrary input and output terminals of integrated circuits can be freely connected to both the thin film wiring layer and the thick film wiring layer. Further, the signal wiring carrying signals which are desired to be propagated at high speed in the thin film wiring layer is not connected to the thick film wiring layer at all and hence it is not affected by large parasitic capacitance possessed by through-holes of the thick film wiring layer, resulting in signal propagation at higher speed.

In addition, optimization processing can be conducted by simultaneously performing automatic wiring with respect to the thin film signal wiring pattern in the thin film wiring layer, the thick film signal wiring pattern in the thick film wiring layer and the wiring pattern used exclusively for connecting them. For example, positions of signal through-holes of the thin film wiring layer and signal through-holes of the thick film wiring layer can be so set that the pattern length of the wiring layer used exclusively for connecting them may be minimized.

Thirdly in accordance with the present invention, the wiring layer used exclusively for connecting the thin film wiring layer and the thick film wiring layer, may not be provided, but signal through-holes of the thin film wiring layer may be directly coupled to the upper portions of signal through-holes of the thick film wiring layer. In this case, the wiring layer used exclusively for interconnection becomes unnecessary and the substrate cost is lowered. Further, since the parasitic capacitance and inductance possessed by the wiring layer used exclusively for interconnection can be removed, signal propagation at a further higher speed becomes possible.

Fourthly in accordance with the present invention, ECL circuits are used to realize high speed operation of integrated circuit chips and transmission lines so terminated respectively by termination resistors as to attain impedance matching are used for signal coupling between integrated circuit chips.

If the thin film signal wiring in the thin film substrate is used as this transmission line, the transmission line has a relatively large resistance value R therein because of the minute shape of the signal wiring. In case a signal having a certain voltage level is inputted to an ECL circuit, the lowest voltage value $V_{iHmin}$ which can be recognized as a signal of high level is present. Therefore, the condition $$H_{iH} > V_{iHmin}$$

must be satisfied. By setting the cross section of each thin film signal wiring so that the direct current resistance value of wiring having the greatest length and included in thin film signal wiring existing within the thin film substrate may not exceed one tenth of the characteristic impedance value of the signal wiring, the condition $V_{ih} > V_{iHmin}$ is satisfied.

Fifthly, by forming the thin film signal wiring layer included within the thin film substrate so that each layer may comprise two layers, i.e., a normal layer for signal wiring and a signal wiring layer for testing, the yield of substrates can be attained.

Sixthly, the wiring layer can be utilized more efficiently because through-holes included within the thin film substrate are arranged in a lattice form with a pitch equivalent to an integer times the lattice pitch of the thin film substrate.

Seventhly, one of factors causing noises can be neglected by matching the characteristic impedance value of the thick film signal wiring layer included in the thick film substrate to the characteristic value of the thin film signal wiring layer included in the thin film substrate, design of the substrate being facilitated.

Eighthly, it becomes possible to pass the thin film signal wiring through an area located under a termination resistor by disposing resistor elements for terminating integrated circuit chips in a layer located right under a test pad on the surface of the thin film substrate so that these resistor elements may be connected to the test pad via partially-through-holes, efficient use of the substrate wiring area being made possible.

Ninthly, the size of the termination resistor element can be made large by disposing the termination resistor element in a boundary area between the test pad and the integrated circuit chip. The larger size of the termination resistor element reduces dispersion in resistance values caused by dispersion in dimensions of termination resistor elements, and hence termination resistor elements with higher precision can be formed.

Tenthly, voltage drop caused in through-holes for thick film power supply input can be reduced to the minimum by connecting a plurality of through-holes for thick film power supply input to a power supply pad.

Eleventhly, signal propagation time between integrated circuit chips can be restrained, and a high-speed electronic circuit apparatus having excellent signal transmission characteristics can be realized.

DESCRIPTION OF THE PREFERRED EMBODIMENTS

Figure 1:
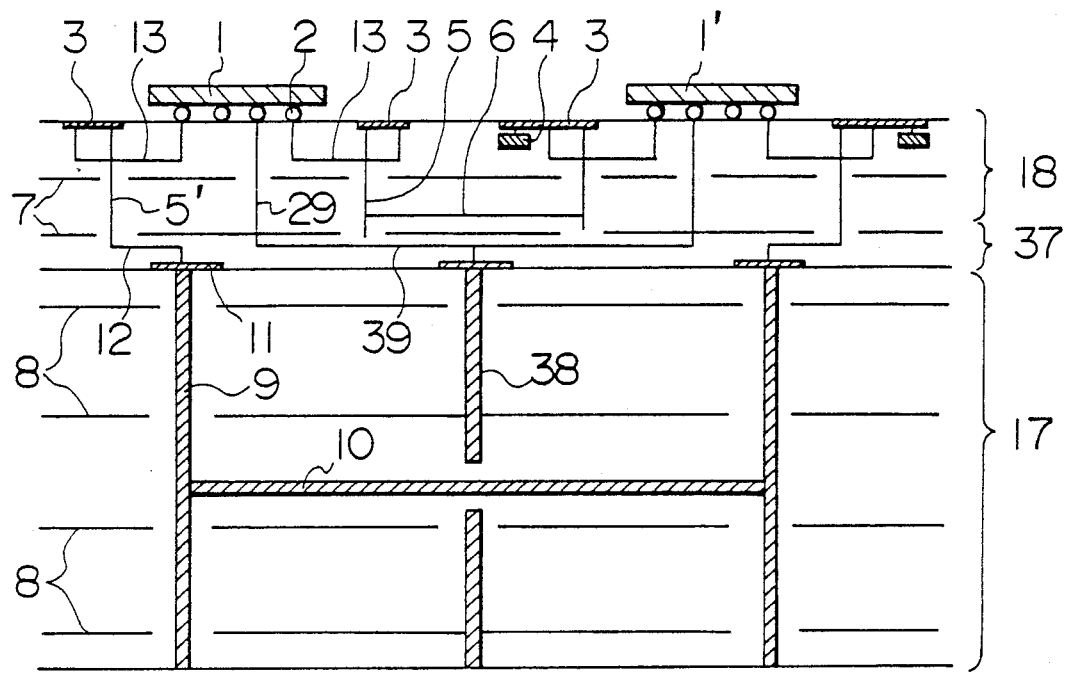
FIG. 1 is a sectional view showing a first embodiment of the present invention.

FIG. 1 is a sectional view showing a first embodiment of the present invention. A thick film and thin film composite substrate comprises a thick film substrate 17 formed by laminating thick film wiring layers using alumina ceramics as an insulation material and tungsten as a conductor material and a thin film substrate 18 formed by laminating thin film wiring layers using polyimide as an insulation material and copper as a conductor material.

Further, on the surface of the thick film and thin film composite substrate, an integrated circuit chip 1 comprising an ECL circuit is connected to the surface of the thin film substrate 18 by a CCB bump 2 comprising solder.

A signal which is included in output signals of one integrated circuit chip 1 and which should pass only the thin film substrate 18 enters thin film signal wiring 6 via signal spread wiring 13, a test pad 3 and a thin film signal through-hole 5. The signal which has entered the thin film signal wiring 6 follows a course opposite to that just described, i.e., passes through a thin film signal through-hole, a test pad and signal spread wiring and then enters a CCB bump of another integrated circuit chip 1'. Thin film power supply layers 7 are disposed above and under the thin film signal wiring 6 to feed power to the integrated circuit chips 1 and 1' and also function as AC ground layers for thin film wiring.

A signal which is included in output signals of the integrated circuit chip 1 and which should pass through the thick film substrate 17 passes through the signal spread wiring 13, the test pad 3, and the thin film signal through-hole 5' in the same way as the above described signal passing through only the thin film substrate. Thereafter, that signal passes through wiring it exclusively for connection between the thick film substrate and the thin film substrate (hereafter referred to as connection wiring 11), which is connected to the lower portion of the thin film signal through-hole 5', and then enters the connection pad 11 formed on the surface of the thick film substrate 17. A thick film signal through-hole 9 is connected to the bottom of the connection pad 11. The signal enters thick signal wiring 10 via the thick signal through-hole 9. The signal which has entered the thick film signal wiring 10 follows a course opposite to that just described and enters the integrated circuit chip 1' of the input side. Thick film power supply layers 8 disposed within the thick film substrate 17 feed power to the integrated circuit chips 1 and 1' and also function as AC ground layers for thick film wiring in the same way as the thin film power supply layer 7.

Further, the thick film power supply layer 8 included in the thick film substrate 17 and the thin film power supply layer 7 included in the thin film substrate 18 are interconnected by a thick film power supply through-hole 38, power supply connection wiring 39, and a thin film power supply through-hole 29. Through this path, power is fed from a power supply pin 35 (refer to FIG. 9b) connected to the thick film power supply through-hole to the CCB terminal 2 of the integrated circuit chips 1 and 1'.

In the present embodiment, signal wiring for feeding clocks and wiring for test and maintenance of integrated circuit chips are housed in the thick film wiring layer 10 included in the thick film substrate 17. Remaining general signals are housed in the thin film wiring layer 6 included in the thin film substrate 18. A thin film and thick film wiring substrate formed in the present embodiment comprises four thin film signal wiring layers 6 and fourteen thick film signal wiring layers 10. Layer structure of the substrate will hereafter be described in detail.

First of all, the thin film substrate 18 comprises ten thin film wiring layers in order of a surface layer, a termination resistor layer, a signal spread layer, a first thin film power supply layer, a first thin film signal layer, a second thin film signal layer, a second thin film power supply layer, a third thin film signal layer, a fourth thin film signal layer and a third thin film power supply layer successively from the integrated circuit chip side. The surface layer corresponds to the layer wherein the test pad 3 of FIG. 1 is disposed. The termination resistor layer corresponds to the layer wherein the termination resistor 4 is disposed. The signal spread layer corresponds to the layer wherein the signal spread wiring 13 is disposed. The first and third thin film power supply layers correspond to layers wherein the thin film power layers 7 are disposed. The fourth thin film signal layer corresponds to the layer wherein the thin film signal wiring 6 is disposed. In order to avoid complexity of the drawing, the first, second and third thin film signal layers and the second thin film power supply layer are omitted.

Under the thin film substrate 18, a wiring layer 37 used exclusively for connecting the thin film substrate 18 and the thick film substrate 17 is formed integrally with the thin film substrate 18 by using a thin film process. The signal connection wiring 12 and the power supply connection wiring 39 shown in FIG. 1 are disposed in the wiring layer 37.

Beginning with the thin film substrate side, the thick film substrate 17 comprises a connection pad layer, a first thick film power supply layer, a first thick film signal layer, a second thick film signal layer, a second thick film power supply layer, a third thick film signal layer, a fourth thick film signal layer, a third thick film power supply layer, . . . , an eighth thick film power supply layer, and a back layer. In sets of two, fourteen thick film signal layers are sandwiched by eight thick film power supply layers. The thick film substrate 17 comprises twenty-four layers in total, including one connection pad layer and one back layer. The connection pad layer corresponds to a layer wherein the connection pad 11 of FIG. 1 is disposed. In order to avoid complexity of drawing, only four out of eight thick film power supply layers are shown as the thick film power supply layers 8 in FIG. 1. Only one out of fourteen thick film signal layers is shown in FIG. 1 as the layer wherein the thick film signal wiring 10 is disposed.

The lattice pitch of the substrate of the present embodiment is 50 $\mu$m in the thin film wiring layer and 500 $\mu$m in the thick film wiring layer.

The characteristic impedance is chosen to be 56 $\Omega$ in both the thin film signal wiring and the thick film signal wiring. In order to realize the characteristic impedance of 56 $\Omega$, thin film signal wiring having wiring width of 20 $\mu$m and wiring thickness of 20 $\mu$m was formed in polyimide resin having dielectric constant of 3.5 in case of the thin film wiring layer. As for the distance from a thin film power supply layer to thin film signal wiring, the distance from the first thin film power supply layer to the first thin film signal layer is 20 $\mu$m and the distance from the first thin film signal layer to the second thin film signal layer is 20 $\mu$m, whereas the distance from the second thin film signal layer to the second thin film power supply layer is 20 $\mu$m. The same holds true in other combinations of thin film wiring layers and thin film power supply layers.

In case of thick film wiring layers, thick film signal wiring having wiring width of 100 $\mu$m and wiring thickness of 30 $\mu$m was formed in alumina ceramic having a dielectric constant value of 9. As for the distance from a thick film power supply layer to thick film signal wiring, the distance from the first thick film power supply layer to the first thick film signal layer is 200 $\mu$m and the distance from the first thick film signal layer to the second thick film signal layer is 200 $\mu$m, whereas the distance from the second thick film signal layer to the second thick film power supply layer is 200 $\mu$m. The same holds true in other combinations of thick film wiring layers and thick film power supply layers.

Operation will now be described. First of all, signal wiring is classified into that needing high speed propagation and that which does not need high speed propagation, and the signal wiring needing high speed propagation is disposed in a thin film wiring layer and the signal wiring which does not need so high speed propagation is disposed in a thick film wiring layer.

As a typical example of thick film and thin film composite substrates, it is now assumed that a thin film substrate 18 made of polyimide comprising four signal wiring layers is formed above a thick film substrate 17 made of alumina ceramic comprising fourteen signal wiring layers. The lattice pitch is chosen to be 500 $\mu$m in the thick film substrate and 50 $\mu$m in the thin film substrate. In this case, the lattice pitch in the thin film portion differs from that in the thick film portion by ten times, and hence the amount of wiring housed in one signal wiring layer of the thin film substrate is equivalent to that housed in ten signal wiring layers of the thick film substrate. Considering this, the number of equivalent signal wiring layers becomes 5.4 in case this substrate is entirely formed by using thin film signal wiring layers, whereas the number of equivalent signal wiring layers becomes 54 in case this substrate is entirely formed by using thick film signal wiring layers. Further, in case substrates housing identical amounts of wiring are formed, the cost of the thin film wiring forming process becomes approximately ten times the cost of the thick film wiring forming process. Assuming now that the cost of the above described substrate formed by using only thin film wiring layers is 1.0 and the cost of the above described substrate formed by using only thick film wiring layers is 0.1, the relative cost of the thick film and thin film composite substrate can be calculated roughly as follows.

$$1.0 \times \frac{4}{5.4} + 0.1 \times \frac{14}{54} \approx 0.77$$

As compared with the case where the substrate is formed by using only thin film wiring layers, the cost has been reduced by approximately 23%.

Considering that the dielectric constant of alumina ceramic is approximately 9 and the dielectric constant of polyimide resin is approximately 3.5, however, the signal propagation delay time of a wiring substrate is typically in proportion to the square root of the dielectric constant of the substrate material. Therefore, the difference in propagation delay time between the thick film signal wiring and the thin film signal wiring is increased to approximately 1.6 times. Under this situation, the processing performance of the computer is limited by the slow alumina ceramic thick film portion of the substrate.

On the other hand, logic signals transmitted in an electronic circuit apparatus included in a computer or the like comprise two kinds of signals, i.e., signals which must be propagated as quickly as possible because the processing speed of the computer depends upon the propagation thereof and signals which do not need to be propagated so quickly (such as signal which have no relation to the response speed of the electronic circuit apparatus) because the propagation time leaves a margin in comparison with the first mentioned signals. By disposing the signal wiring needing high-speed propagation in a thin film wiring layer and the signal wiring which does not need so high-speed propagation in a thick film wiring layer, therefore, the processing speed of the computer depends upon only the delay time of the thin film signal wiring, and the processing speed of the computer is not affected by the delay time in thick film signal wiring introduced for the purpose of cost reduction.

As signals included in the above described logic signals which do not need to be propagated so quickly and especially bringing about an effect when disposed in a thick film wiring layer, signals for supplying clocks and signals for test and maintenance of the integrated circuit chips can be mentioned.

The object of the signals for supplying clocks is to synchronize all integrated circuit chips on the wiring substrate. When signals are supplied to respective integrated circuit chips, therefore, respective signals need only align in phase. That is to say, if signals outputted from an integrated circuit chip for supplying clock simultaneously arrives at other general integrated circuit chips, their absolute delay time do not pose a problem. Even if wiring for supplying clock is disposed in the thick film wiring layer, therefore, the processing speed of the computer or the like is not affected by it so long every wiring for clock has identical length.

Further, the wiring for test and maintenance of integrated circuit chips aims at confirming that the logical operation in an integrated circuit chip is normal by setting a signal into a latch circuit included in the integrated circuit chip and reading a signal from the latch circuit, for example. Even if the wiring for test and maintenance of integrated circuit chips is disposed in a thick film wiring layer and signal setting into a latch circuit and signal readout from the latch circuit are delayed, therefore, this does not lower the operation speed of the computer or the like and this does affect the test and maintenance function itself.

Secondly, the wiring layer exclusively for connecting the thin film substrate and the thick film substrate will now be described. As shown in FIG. 1, this wiring layer 37 is present between the thin film substrate 18 and the thick film substrate 17. Therefore, the bottom portion of an arbitrary signal through-hole of the thin film substrate can be connected to the top portion of an arbitrary through-hole of the thick film substrate by connection wiring 12. By connecting the input and terminal 2 (such as CCB bump; the same shall apply hereinafter) of an integrated circuit chip to a signal through-hole 5 of the thin film substrate 18 beforehand, thin film signal wiring 6 may be pulled out from this signal through-hole 5 in case only a thin film wiring layer is used. In case a thick film wiring layer 10 included in the thick film substrate is used, a signal through-hole 5' included in the thin film substrate may be connected to a signal through-hole 9 included in the thick film substrate 17 by using the above described connection wiring 12. By adopting such a connection scheme, an arbitrary input/output terminal of an integrated circuit chip can be freely connected to either thin film wiring included in the thin film substrate or thick film wiring included in the thick film substrate as occasion demands. Further, a signal through-hole 5 of a thin film wiring layer which does not need to be connected to a thick film wiring layer, i.e., signal wiring needing high-speed propagation in a thin film wiring layer is not connected to the thick film substrate at all, and hence the signal propagation is not affected by large parasitic capacitance possessed by a through-hole of the thick film wiring substrate, signal propagation at higher speed being realized.

By forming the wiring layer 37 for exclusive use as the lowest layer of the thin film multiple wiring layers 18 in this case, minute thin film wiring can be used as the connection wiring 12, and hence the number of wiring layer required for the wiring layer 37 for exclusive use can be reduced.

From the viewpoint of signal characteristics, it is desirable that the characteristic impedance value of the connection wiring 12 coincides with that of the thin film signal wiring 6 and the thick film signal wiring 10. Since the wiring layer 37 for exclusive use is located between the thin film multiple wiring layers 18 and the thick film multiple wiring layers 17 having different substrate materials, however, it is not easy to exercise accurate control over the thickness of insulation material. The characteristic impedance value of the connection wiring 12 largely depending upon the thickness of the insulation material also disperses. However, the length of connection wiring in the present structure is as short as several mm and the connection wiring can be regarded as a lumped constant circuit element from the viewpoint of signal propagation. In a range wherein reflection noises caused by a capacitance component poses no problem, therefore, it is not necessary to make the characteristic impedance value coincide with that of the thin film signal wiring 6 or the thick film signal wiring 10. By establishing condition that the characteristic impedance value of the connection wiring 12 may differ from the characteristic impedance value of the thin film signal wiring 6 and the thick film signal wiring 10, therefore, accurate control of insulation material thickness in the boundary portion between the thick film substrate 18 and the thick film substrate 17 becomes unnecessary, the process for forming the substrate can be simplified.

Further, in case the difference between the lattice pitch of the thin film wiring layer and that of the thick film wiring layer is as large as approximately the times, the number of through-holes in the thick film signal layer becomes extremely smaller than the number of through-holes in the thin film signal layer. In many cases, therefore, a signal through-hole of a thick film wiring layer cannot be disposed near a through-hole of a thin film wiring layer to be connected. Even in such a case, arbitrary through-holes can be interconnected by using the above described wiring layer 37 for exclusive use. Therefore, through-holes located at a great distance can be easily interconnected.

Further, on the surface of the thin film substrate (i.e., thin film multiple wiring layers) 18, a test pattern for integrated circuit chip referred to as test pad 3 is located around the integrated circuit chip 1. The input/output terminal 2 of the integrated circuit chip and the test pad 3 are interconnected by the signal spread wiring 13 included in the thin film substrate. The signal through-holes 5 and 5' of the thin film multiple wiring layers 18 are directly coupled to the test pads 3. In the thin film right under the integrated circuit chip 1, effective signal through-holes 5 and 5' are not present. In general, the lattice pitch of the thin film multiple layers is very minute. Even if signal through-holes are not disposed in an area right under integrated circuit chips, therefore, a sufficient number of signal through-holes can be ensured. In the thick film multilayer wiring substrate 17 having a large lattice pitch, however, the number of lattice points of the through-holes 9 which can be disposed is smaller than that of the thin film multilayer wiring substrate 18. Therefore, it is not advisable to avoid use of portions located right under integrated circuit chips as signal through-holes. By connecting in this case the signal through-hole 5' of the thin film multilayer wiring substrate directly coupled to the test pad 3 to the signal through-hole 9 located right under the integrated circuit chip 1 and within the thick film multilayer wiring substrate 17 via the above described wiring layer 12 for exclusive use, all of the lattice points whereat signal through-holes can be disposed in the thick film multilayer wiring substrate can be effectively used. As a result, increase of unnecessary wiring areas can be prevented.

Connection of signal wiring in the thin film multilayer wiring substrate and the thick film multilayer wiring substrate has heretofore been described. In addition to signal wiring, however, power supply wiring for feeding power supply to integrated circuit chips are present in the wiring substrate. Connection between the thin film power supply layer 7 and the thick film power supply layer 8 for power supply is also necessary. By incorporating the wiring 12 for signal connection and the wiring 39 for power supply connection mixedly into the above described wiring layer 37 for exclusive use, connection of power supply can be performed without adding a new wiring layer or using a part of the thin film wiring layer or the thick film wiring layer originally provided for housing signal wiring.

Since in this case the current of the power supply wiring is typically larger than the current of signal wiring, it is effective to make the wiring pattern width of the power supply connection wiring 39 thicker than that of the signal connection wiring 12. Thereby, the DC voltage drop and AC noises can be suppressed to the minimum.

Positions of the through-holes 5' and 29 of the thin film multilayer wiring substrate 18 and the through-holes 9 and 38 of the thick film multilayer wiring substrate 17 which should be interconnected by using the above described wiring layer 37 for exclusive use vary depending upon kinds of the integrated circuit chips 1 and 1' mounted on the wiring substrate. It is thus impossible to dispose a fixed wiring pattern within the substrate beforehand. Automatic wiring processing using a computer or the like has conventionally conducted with respect to the signal wiring pattern 6 or 10 included in the thin film multilayer wiring substrate 18 or the thick film multilayer wiring substrate. With respect to the wiring layer 37 used exclusively for connection as well, however, it is effective to perform automatic wiring processing simultaneously with the above described signal wiring pattern 6 or 10.

Optimization processing can be conducted by simultaneously performing automatic wiring with respect to the signal wiring pattern 6 in the thin film multilayer wiring substrate 18, the signal wiring pattern 10 in the thick film multilayer wiring substrate 17, and the wiring pattern 12 in the wiring layer 37 used exclusively for connecting them. For example, positions of signal through-holes 5' of the thin film multilayer wiring substrate 18 and signal through-holes 9 of the thick film multilayer wiring substrate 17 can be so set that the length of the wiring pattern 12 in the wiring layer 37 used exclusively for connecting them may be minimized.

The case where the wiring layer 37 used exclusively for connecting the thin film multilayer wiring substrate 18 and the thick film multilayer wiring substrate 17 is not provided, but signal through-holes 5' of the thin film multilayer wiring substrate 18 are directly coupled to the upper portions of the signal through-holes 9 of the thick film multilayer wiring substrate 17 will now be described.

Figure 2:
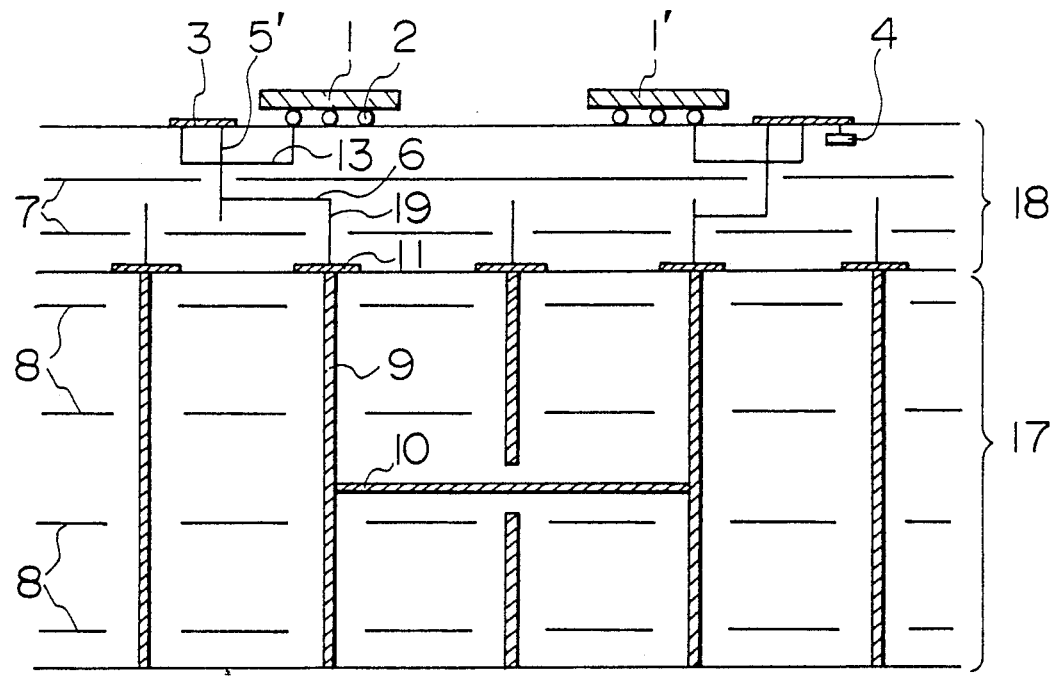
FIG. 2 is a sectional view showing a second embodiment of the present invention.

FIG. 2 is a sectional view showing a second embodiment of the present invention. In the present embodiment, the thick film signal through-hole 9 is directly coupled to a thin film signal through-hole 19 without intervention of the connection wiring 12 as described with respect to the first embodiment. In the present embodiment, a signal which should pass through the thick film multilayer wiring substrate 17 passes through the signal spread wiring 13, the test pad 3 and the thin film signal through-hole 5 in the same way as the first embodiment. Thereafter, the signal passes through the thin film signal wiring 6 and enters the thin film signal through-hole 19 unlike the first embodiment. As described above, all thick film signal through-holes existing in the thick film multilayer wiring substrate are connected to thin film signal through-holes existing right above respective thick film signal through-holes. In case of the signal path which is now being described as well, the signal which has entered the thin film signal through-hole 19 passes through the thick film signal through-hole 9 and enters the thick film signal wiring 10. Following a course opposite to that just described, the signal supplied from the thick film signal wiring 10 centers the integrated circuit chip 1' of the input side.

In the present embodiment, the lattice pitches of the thick film wiring layer and the thin film wiring layer are so set respectively at 500 $\mu$m and 50 $\mu$m that the ratio between them may become 10. Other design constants are the same as those of the first embodiment with the exception of the connection method between the thick film wiring layer and the thin film wiring layer.

In this case, the signal connection between the thin film multilayer wiring substrate 18 and the thick film multilayer wiring substrate is conducted by connecting the signal through-hole 5' of the thin film multilayer wiring substrate 18 connected to the input/output terminal 2 of the integrated circuit chips 1 and 1' to the signal through-hole 19 of the thin film multilayer wiring substrate 18 directly coupled to the signal through-hole 9 of the thick film multilayer wiring substrate 17 by means of the general signal wiring 6 included in the thin film multilayer wiring substrate 18 as shown in FIG. 2. By using this scheme, the wiring layer 37 provided exclusively for the above described connection becomes unnecessary, resulting in a reduced substrate cost. Further, since the parasitic capacitance and inductance possessed by the wiring layer 37 used exclusively for connection can be removed, signal propagation at further high speed becomes possible.

In many wiring substrates at the present time, the surface of the substrate is divided into partitions in X and Y directions referred to as lattices and through-holes are formed at respective lattice points. If the lattice pitch of the thick film multilayer wiring substrate 17 is an integer times that of the thin film multilayer wiring substrate 18 in case of the above described scheme wherein the wiring layer 37 exclusively for connection is not used, all of the lattice points of the thick film multilayer wiring substrate 17 lie upon the lattice points of the thin film multilayer wiring substrate 18. Therefore, the signal through-holes 19 of the thin film multilayer wiring substrate 18 can be easily disposed right above the signal through-holes 9 of the thick film multilayer wiring substrate 17.

Figure 4A:
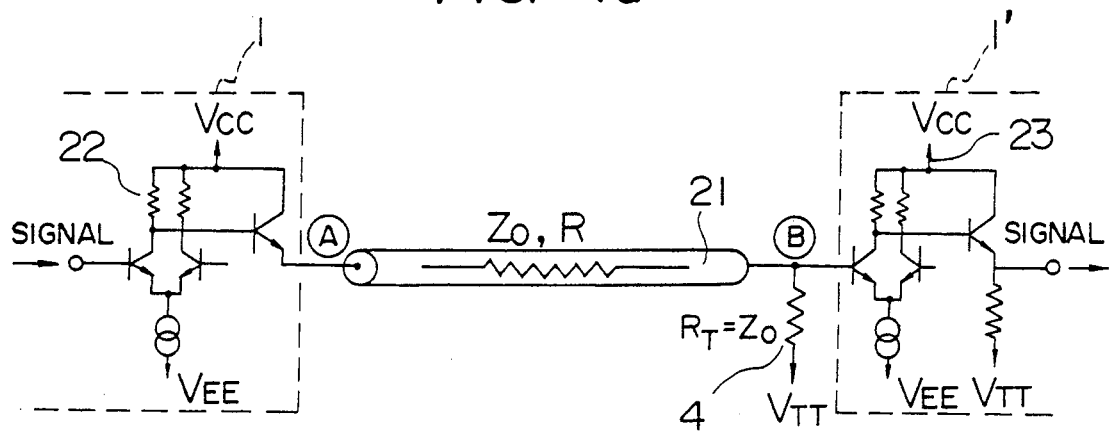
FIGS. 4a to 4c are a block diagram and graphic diagrams used for description of the permissible upper limit value of the wiring resistance.

Optimization of the cross section of the signal wiring pattern in the thin film signal wiring layer will now be described. In the present invention, ECL circuits are used in order to realize the high-speed operation of integrated circuit chips. As shown in FIG. 4a, a transmission line 21 having characteristic impedance $z_o$ terminated by a termination resistor 4 so as to attain impedance matching is used for signal connection between the integrated circuit chips 1 and 1'.

Assuming now that the signal wiring 6 in the thin film multilayer wiring substrate 18 is used as this transmission line 21, the transmission line 21 has a relatively large resistance value R therein because the shape of the signal wiring 6 is minute. When a logic signal having a high level (i.e., voltage $V_{oH}$) is outputted at point A of the transmission side from an output circuit 22 included in the integrated circuit chip 1 onto the transmission line 21, therefore, voltage $V_{iH}$ inputted at point B of the receiving side to an input circuit 23 included in the integrated circuit chip 1' can be represented by the following equation.

$$V_{oH} - V_{iH} = (V_{oH} - V_{TT}) \times \frac{R}{R + z_o} \quad (1)$$

Figure 4B:
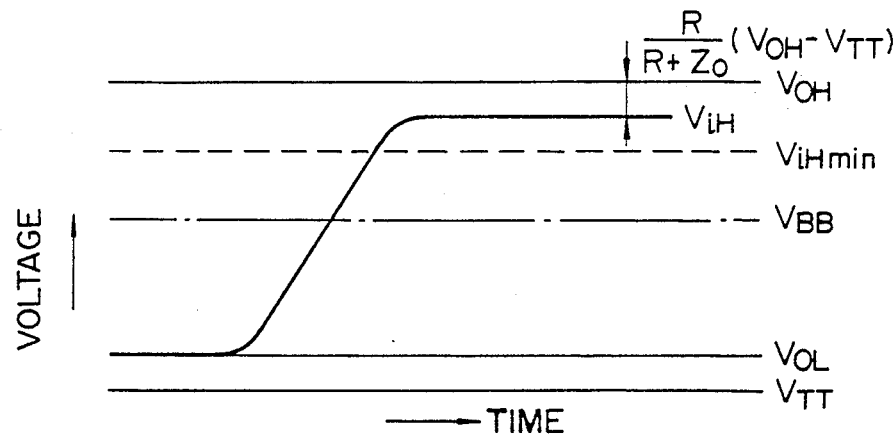

That is to say, voltage drop as shown in FIG. 4b is caused. In case a signal having a certain voltage level is inputted to an ECL circuit, the lowest voltage value $V_{iHmin}$ which can be recognized as a signal of high level is present. Therefore, the condition $$V_{iH} > V_{iHmin} \quad (2)$$

must be satisfied. Substituting the right side of equation (1) multiplied by 2 as the safety factor on design into equation (2) and rearranging equation (2) with respect to $R/z_o$, we get the following relation.

$$\frac{R}{z_o} < \frac{V_{oH} - V_{iHmin}}{V_{oH} - 2V_{TT} + V_{iHmin}} \quad (3)$$

Figure 4C:
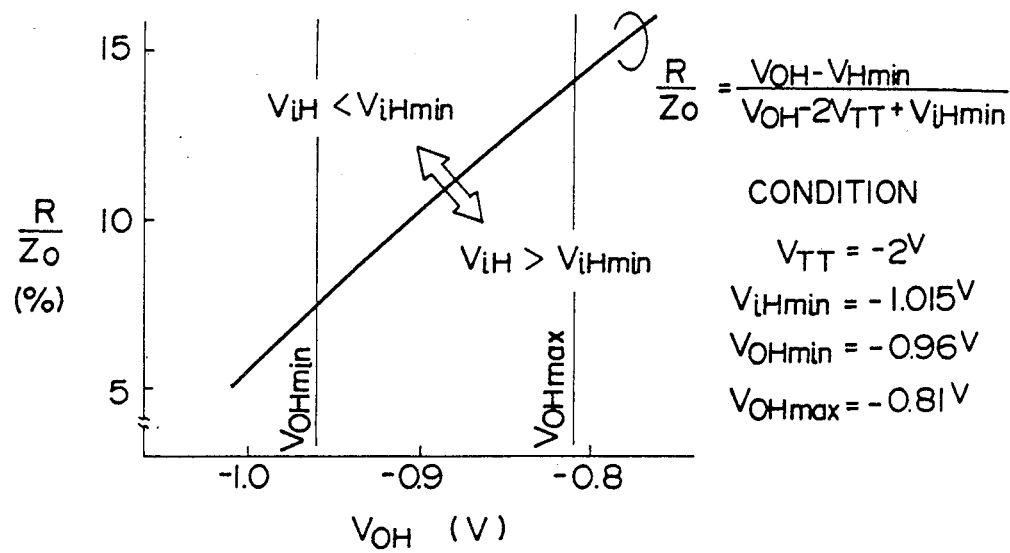

FIG. 4c shows equation (3) by taking characteristic values of an ECL chip of MECL10000 series as an example. In the range of dispersion of $V_{oH}$ (−0.96 to −0.18 V) caused by chip characteristics, it is found from FIG. 4c that the condition $V_{iH} > V_{iHmin}$ can be satisfied when $R/z_o$ is so defined as to be approximately 10% or less.

Further, the value of R is related to the length L of the signal wiring, cross section S thereof and resistivity $\rho$ thereof by the following equation.

$$R = \rho L/S \quad (4)$$

With respect to signal wiring housed in the wiring substrate and having the largest wiring length, therefore, the value of S satisfying the relation $$R = 0.1 z_o$$

is derived from equation (4) to define the cross section of each signal wiring.

Figure 5A:
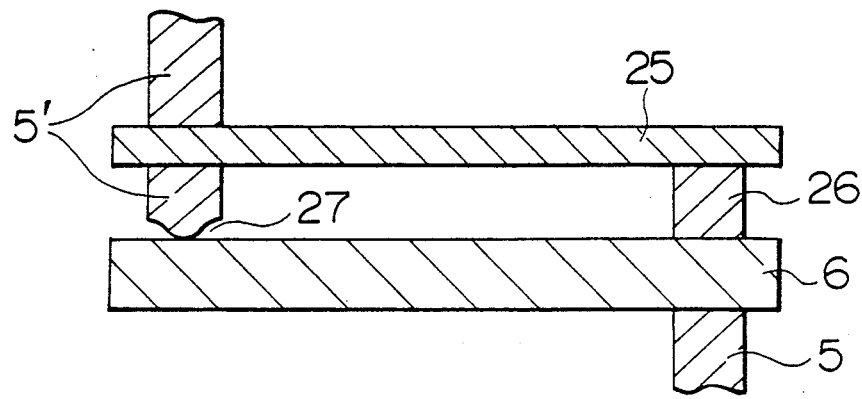
FIG. 5a is a sectional view showing a wiring layer for testing.

A signal wiring layer for test will now be described. FIG. 5a is a sectional view showing the inside of the thin film multilayer wiring substrate 18 and showing the function of the signal wiring layer for test by taking a signal wiring path extending from the thin film signal through-hole 5 to the thin film signal through-hole 5' via the thin film signal wiring 6 as an example. If a defect 27 is present in the connection portion between the thin film signal wiring 6 and the thin film signal through-hole 5', for example, that path cannot be used as the signal wiring path. In FIG. 5a, however, a wiring layer 25 for test disposed above the thin film signal wiring layer 6 is used to form a backup signal path extending from the thin film signal through-hole 5 to the thin film signal through-hole 5' via a test through-hole 26 and test wiring 25, resulting in improved yield of the substrate.

The effect of improvement in yield will now be described concretely. It is now assumed that yield per layer of the substrate is $\alpha$. In case a substrate comprising n layers which is not provided with the test wiring layer is formed, yield per substrate becomes $\alpha^n$. In a substrate having the test wiring layer, however, detects caused with probability of $(1-\alpha)$ per normal signal wiring layer can be relieved by the test wiring layer at the rate of $\alpha(1-\alpha)$. Regarding a normal signal wiring layer plus a test wiring layer paired with this as one layer, the yield per layer can be improved to the following value.

$$\alpha30 \ \alpha(1-\alpha) = \alpha(2-\alpha) \quad (5)$$

In case a substrate comprising n layers is formed, therefore, the yield per substrate can be represented by the following function:

$$\{\alpha(2-\alpha)\}^n.$$

Figure 5B:
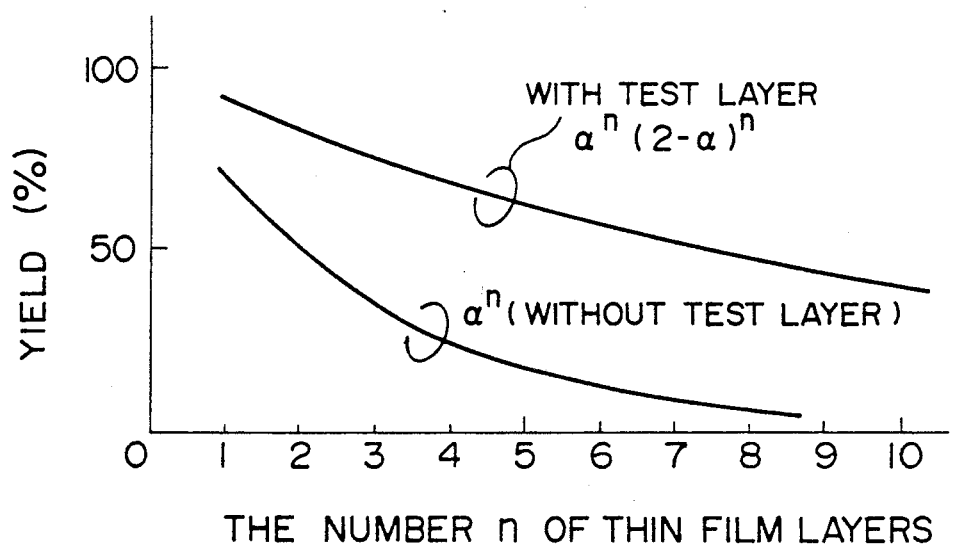
FIG. 5b is a graphic diagram showing the relation between the yield and the number of thin film layers.

On the basis of the above described discussion, FIG. 5b shows the relationship between the number n of substrate layers and yield under the condition that $\alpha=0.7$ for the case where the test wiring layer is present and the case where the test wiring layer is not present. Under the condition that the yield is 50%, a substrate comprising up to two layers can be formed if the substrate is not provided with the test wiring layer whereas a substrate comprising up to approximately seven layers can be formed if the substrate is provided with the test wiring layer. Improvement of yield is thus noticeable.

The case where through-holes within the thin film substrate are arranged in a lattice form will now be described. In general, there are two kinds of substrate wiring scheme. In one scheme, only through-holes are disposed on lattice points and wiring is passed between through-holes. In the other scheme, both through-holes and wiring can be disposed on lattice points. Even if a through-hole is disposed on an arbitrary lattice point in the former case, the wiring area is not cut down thereby. If a through-hole is disposed on an arbitrary lattice point in case of the latter scheme, however, the wiring area is divided into sections by that through-hole itself and hence a contrivance is needed for arrangement of through-holes. Assuming now in the latter case that $m^2$ through-holes are arranged in a local area comprising N lattice points x N lattice points included in the thin film substrate, $m^2$ areas among N wiring areas are divided into sections by through-holes if the through-holes are arranged at random. If through-holes are arranged in an m x m lattice form, only m wiring areas are divided into sections, resulting in efficient use of wiring areas. The above described discussion has been conducted for the case where m/N is as small as approximately 0.1 to 0.5. Even in case through-holes are arranged at random, the number of wiring areas divided into sections approaches m from $m^2$ as m/N is increased. However, it is not improved beyond m which is the value obtained in case where through-holes are arranged in a lattice form beforehand.

Impedance matching of the thick film substrate and the thin film substrate will now be described. The thick film portion and the thin film portion of the thick film and thin film composite substrate heretofore described are physically separated. In design of the wiring substrate, however, it is desirable that the difference in characteristics between them does not appear in the limielight as the limiting factors of design as far as possible. As one of the limiting factors, characteristic impedance mismatch of signal wiring between the thick film substrate portion and the thin film substrate portion can be considered. If lines which are different each other in characteristic impedance are connected, reflection noises are caused when a pulse signal passed through the connection portion. In the characteristic impedance mismatch state, therefore, a signal passing through only the thin film substrate and a signal passing through the thick film substrate differ in the amount of noise generated, resulting in complicated judgment in deciding wiring path. If the characteristic impedance of the signal wiring of the thin film substrate portion is matched to that of the thick film portion, one of noise generation causes can be neglected, substrate design being facilitated.

Figure 6A:
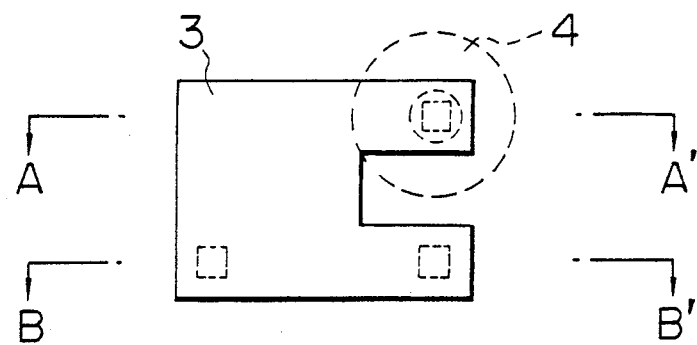
FIGS. 6a to 6c are a plan view and sectional views showing a method of arranging termination resistor elements.
Figure 6B:
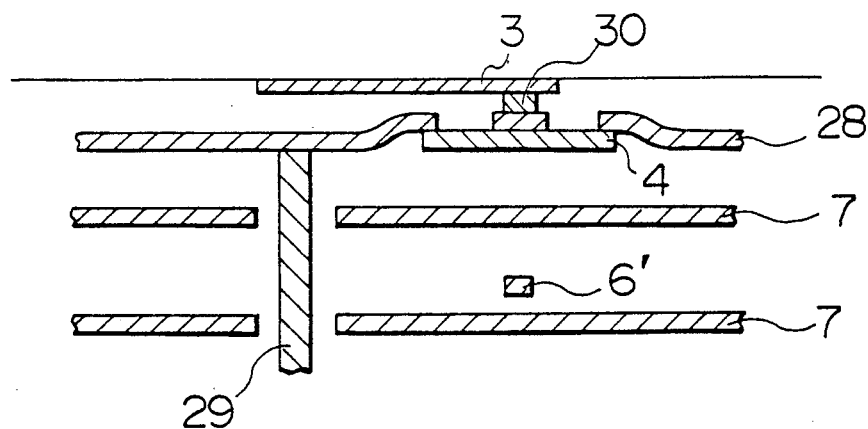
Figure 6C:
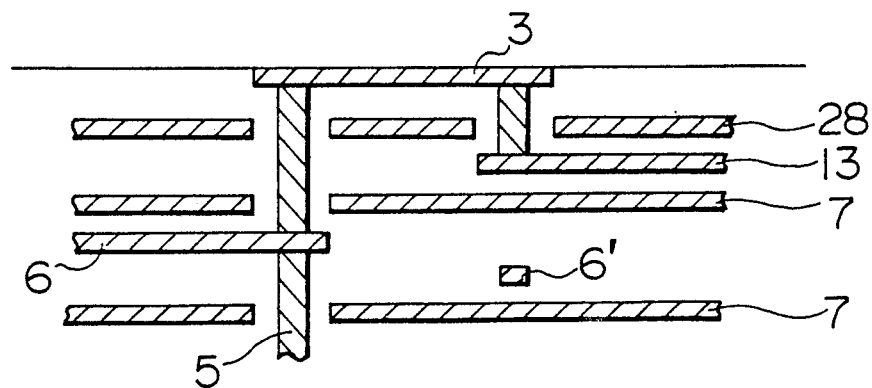

The method of disposing a resistor element right under a test pad located on the surface of the thin film substrate will now be described. FIG. 6a is a plan view showing the test pad 3 located on the surface of the thin film substrate 18. FIG. 6b shows a sectional view seen along a line A - A' of FIG. 6a. FIG. 6c shows a sectional view seen along a line B - B' of FIG. 6a. In a wiring layer right under the test pad 3, the termination resistor 4 and a power supply layer 28 for feeding power supply to the termination resistor are disposed. The test pad 3 and the termination resistor 4 can be selectively connected via a partially-through-hole 30. By thus forming the termination resistor 4 in a layer located right under the test pad 3, it becomes possible to pass thin film signal wiring 6' through an area located under the termination resistor 4, resulting in efficient use of substrate wiring areas.

Figure 7:
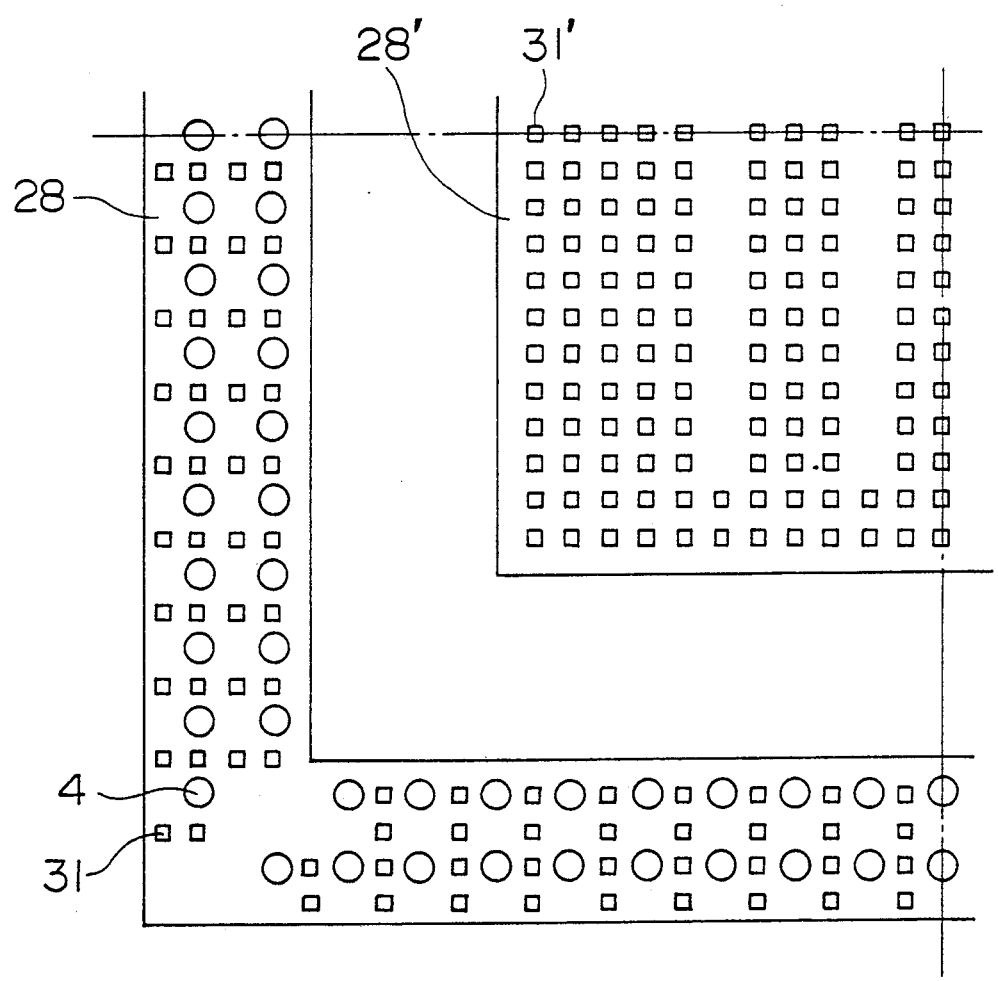
FIG. 7 is a plan view showing a power supply layer for termination resistors.

Further, the test pad 3 and the input/output terminal (not illustrated) of the integrated circuit chip 1 are interconnected by signal spread wiring 13 shown in FIG. 6c. This signal spread wiring 13 is put between the power supply layer 28 for termination register and the thin film power supply layer 7 and has capacitance with respect to these power supply layers. This capacitance becomes one factor causing signal propagation delay of the signal spread wiring 13 and is desired to be small. FIG. 7 is a plan view showing a part of the power supply layer 28 for termination resistor. An area 28' wherein input/output terminals and power supply terminals of integrated circuit chips are present is separated from an area 28 wherein termination resistors 4 are present. An area wherein the power supply layer for termination is not present is disposed between the area 28 and the area 28'. The signal spread wiring 13 shown in FIG. 6c connects a through-hole passing through a clearance 31' of the area 28' and a through-hole passing through a clearance 31 of the area 28. By separating the power supply layer for termination resistor into two areas 28 and 28' as described above, therefore, the capacitance is reduced in the portion wherein the power supply layer is not present, resulting in reduced signal propagation delay time.

Figure 8A:
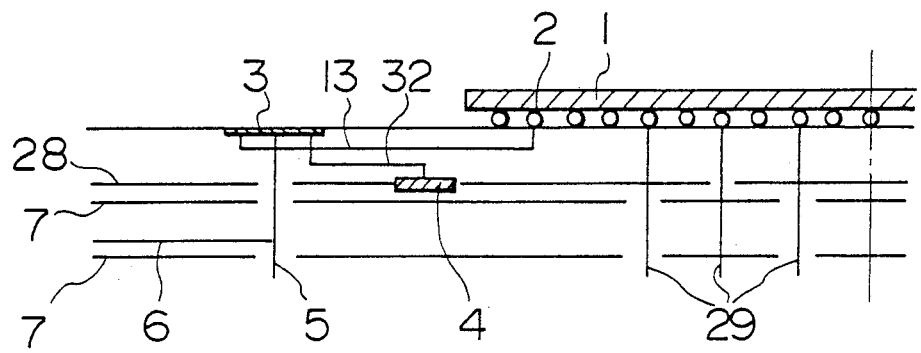
FIGS. 8a and 8b are a sectional view and a plan view showing a second method of arranging termination resistor elements.
Figure 8B:
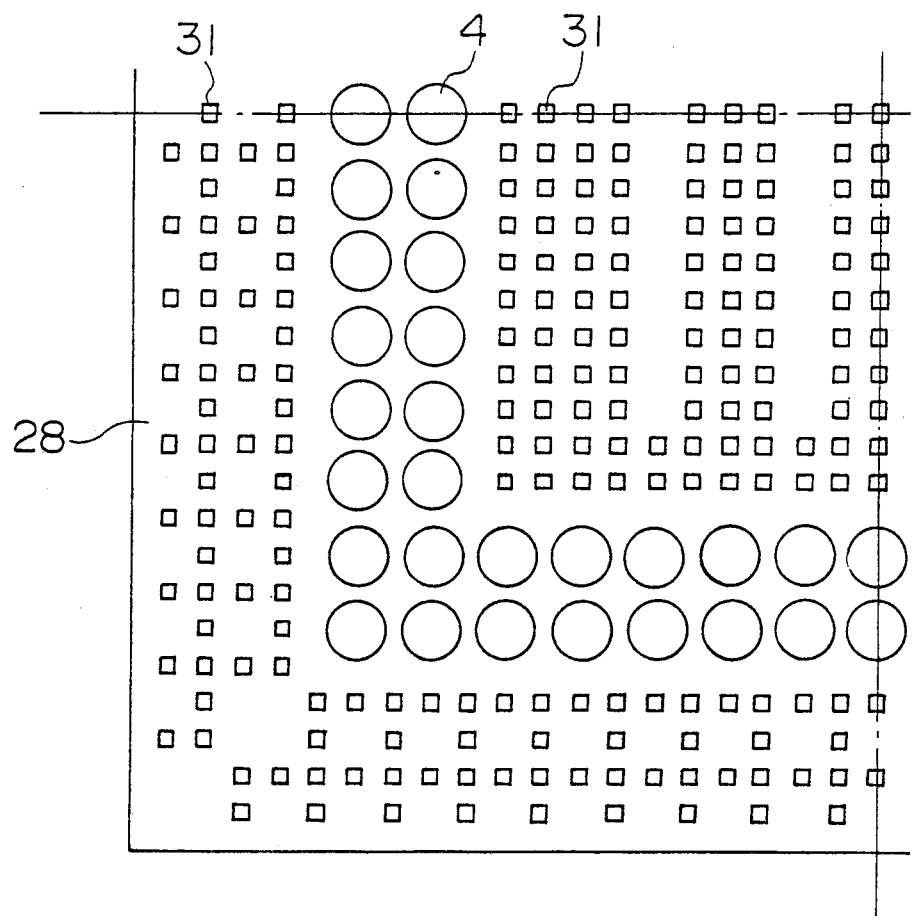

A method of disposing a resistor element for signal termination right under the boundary portion between a test pad and an integrated circuit chip on the surface of the thin film surface will now be described. FIG. 8a is a sectional view showing a resistor element 4 existing right under the boundary portion between the test pad 3 and the integrated circuit chip 1. A plan view of a power supply layer 28 for feeding power to the termination resistor element 4 is shown in FIG. 8b. In case the termination resistor element 4 is disposed right under the test pad 3 as shown in FIGS. 6 and 7, it is impossible to make the size of the termination resistor element larger than that of the test pad because contact between a plurality of through-holes and the termination resistor element must be avoided. By disposing the termination resistor element in the boundary area between the test pad and the integrated circuit chip, however, this limitation is removed and hence the size of the termination resistor element 4 can be made large. If the size of the termination resistor element is made large, the dispersion in resistance value caused by dispersion in dimension of the termination resistor element 4 becomes small and hence the termination resistor element can be formed with higher precision. Further, connection between the test pad 3 and the termination resistor element 4 is performed by using wiring 32 for termination resistor connection. Further, in case of this method as well, the area located under the termination resistor element 4 is not occupied by a through-hole or the like in the same way as the aforementioned case where a termination resistor element is disposed right under a test pad. Therefore, the area located under the termination resistor element 4 can be freely used as the wiring area.

A method of disposing through-holes with respect to pads for mounting signal pins and power supply pins will now be described.

Figure 3:
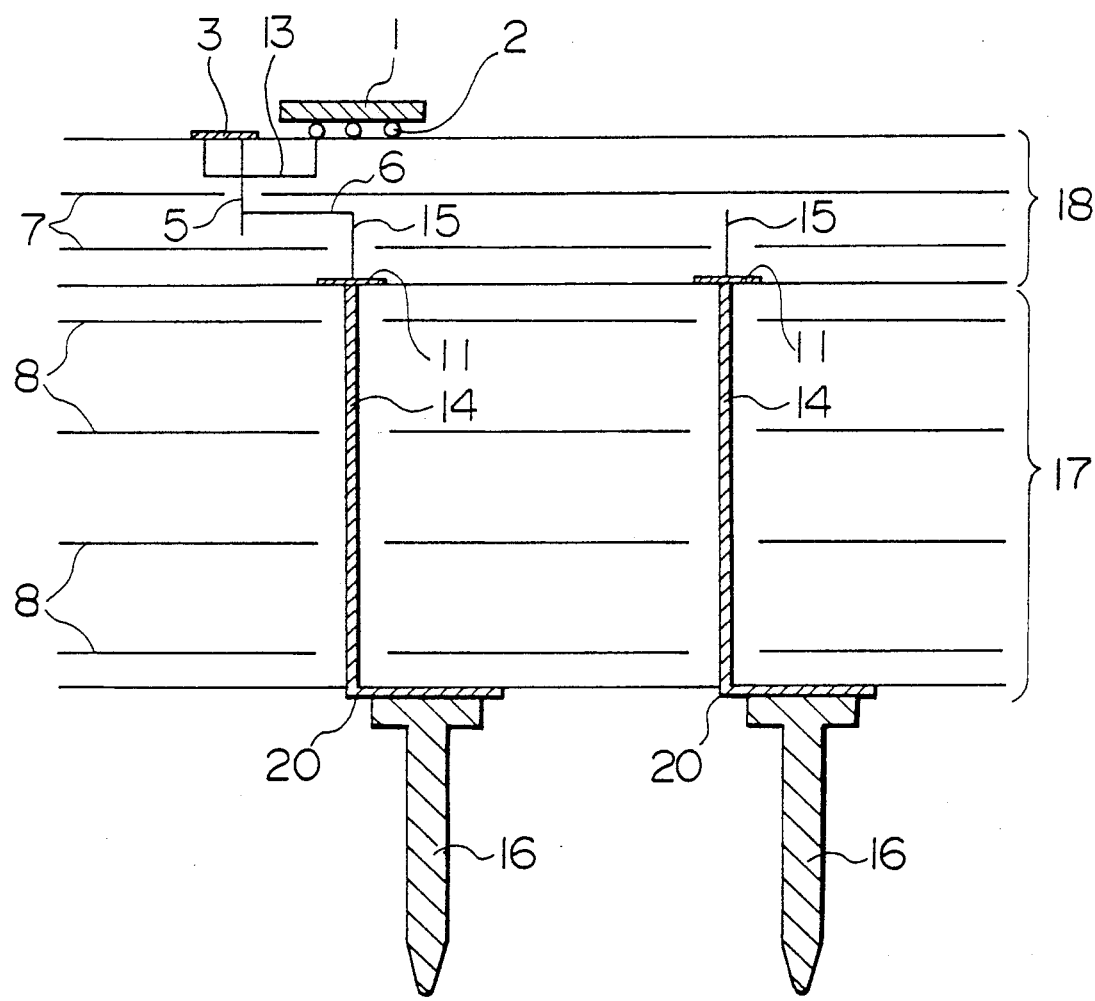
FIG. 3 is a sectional view showing a third embodiment of the present invention.

FIG. 3 is a sectional view showing a third embodiment of the present invention. With reference to the present embodiment, a method for taking out a signal from the thick film and thin film composite substrate to the outside of the substrate will now be described. On the bottom face of the thick film and thin film composite substrate, signal pins 16 made of Kovar are soldered to signal pads 20 by means of solder or the like. The signal pad 20 is connected to a through-hole 14 for thick signal input and output included in the thick film wiring layer 17. A through-hole 15 for thin film input and output located right above the through-hole 14 for thick film signal input and output is directly coupled to the through-hole 14. The through-hole 14 for thick signal input and output and the through-hole 15 for thin film input and output are completely equivalent to the thick film signal through-hole 9 and the thin film signal through-hole 19 described with reference to the second embodiment excepting that the through-holes 14 and 15 are electrically connected to the signal pin 16. Their dimensions and shapes are also the same.

If signal terminals of the integrated circuit 1 are connected to the through-holes 15 for thin film signal input and output by using a method similar to that of the second embodiment, signals of the integrated circuit chip can be led out to the outside of the thick film and thin film composite substrate.

Figure 9A:
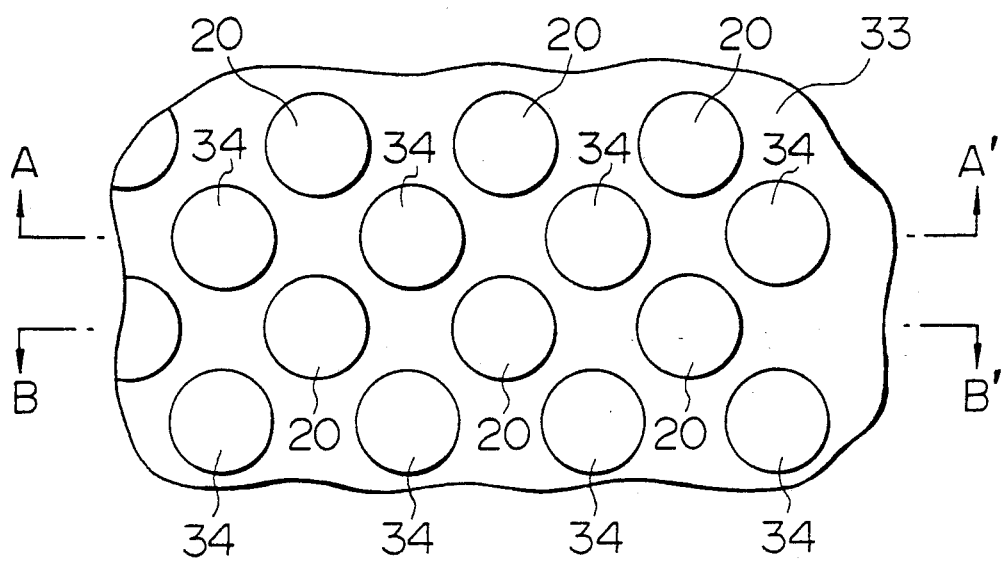
FIGS. 9a to 9c are a plan view and sectional views showing a method of connecting a pad to a thick film through-hole.

FIG. 9a shows arrangement of signal pads 20 and power supply pads 34 on the bottom layer 33 of the thick film substrate 17. Signal pads 20 and power supply pads 34 are arranged respectively at regular intervals. Further, the signal pads 20 are displaced from the power supply pads 34 by half pitch. Collectively viewing both the signal pads 20 and the power supply pads 34, they are arranged in a face-centered form.

Figure 9B:
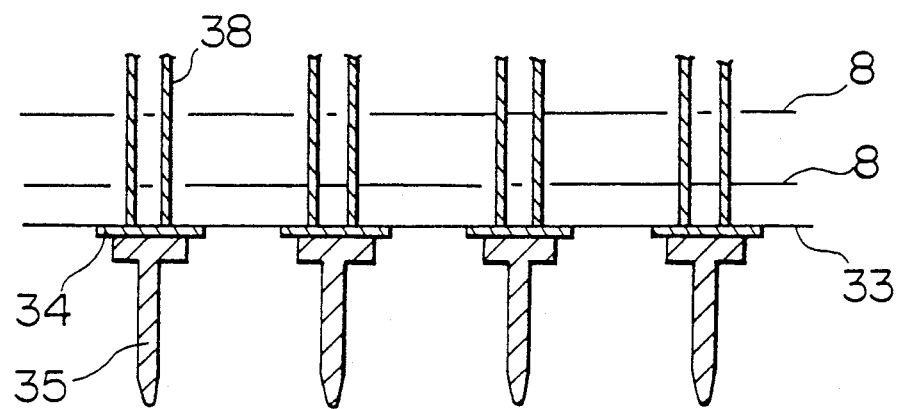

FIG. 9b shows connection of the power supply pads 34 and thick film power supply input through-holes 38 when viewed along line A - A' shown in FIG. 9a. The power supply pad 34 has such a size that the pad contains a plurality of lattice points and the power supply pads 34 are so arranged that the center of each pad may be located between lattice points. Therefore, a plurality of through-holes 38 can be connected to one pad. In general, a larger current flows through a power supply pin 35 as compared with the signal pin 16. By connecting a plurality of thick film power supply input through-holes 38 to the power supply pad 34, therefore, the voltage drop caused in the thick film power supply input through-hole can be reduced to the minimum.

Figure 9C:
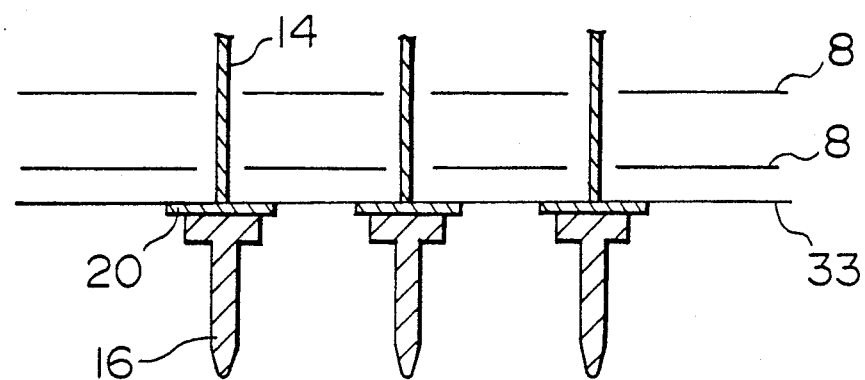

FIG. 9c shows connection of signal input/output pads 20 and thick film signal input/output through-holes 14 when viewed along line B - B' shown in FIG. 9a. The signal pad 20 has the same size as that of the power supply pad 34. Since the center of the signal pad is positioned on a lattice point, however, one signal input/output through-hole 14 can be connected to the signal pad 20.

An electronic circuit apparatus using the above described thick film and thin film composite substrate will now be described.

Figure 10:
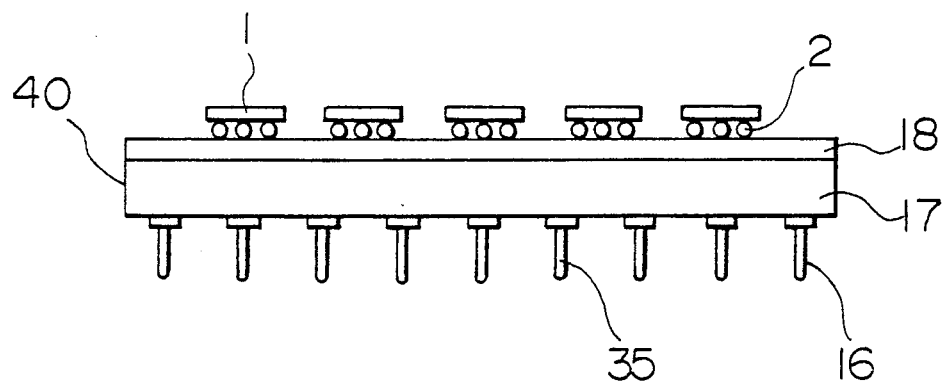
FIG. 10 is a sectional view showing a fourth embodiment of the present invention.

FIG. 10 is a sectional view showing a fourth embodiment of the present invention. An electronic circuit apparatus 40 is formed by connecting a large number of integrated circuit chips 1 to the surface of a thick film and thin film composite substrate, which has been formed by laminating thin film wiring layer 18 above the thick film wiring layer 17 as described before with reference to the first, second or third embodiment, by means of the CCB bumps 2 and by performing interconnection. On the bottom face of the thick film and thin film composite substrate, signal pins 16 and power supply pins 35 for connecting wiring included in the substrate to an outside wiring board are disposed. By adopting the thick film and thin film composite substrate into an electronic circuit apparatus having a large number of integrated circuit chips 1 mounted on a wiring substrate as shown in FIG. 10, the cost of the electronic circuit apparatus can be lowered and the signal propagation time between integrated circuit chips can be suppressed to the minimum.

Further, the constraint in use of ECL circuits caused by DC resistance of signal wiring which has posed a problem in the prior art can be removed. In case an ECL circuit is used as the integrated circuit chip, therefore, the electronic circuit apparatus using the thick film and thin film composite substrate becomes especially effective. An electric circuit apparatus having high processing speed can thus be realized.

The present invention makes it possible to laminate a low cost thick film wiring substrate and a high performance thin film wiring layer without increasing the signal propagation delay time. As a result, a large-sized logic apparatus such as computer, which is lower in cost and higher in performance as compared with prior art apparatus, can be realized.

We claim:

1. A thick film and thin film composite wiring substrate for mounting integrated circuit chips thereon, comprising:
    a thin film substrate including a first signal wiring layer therein, said first signal wiring layer including a signal wiring for electrically interconnecting signal terminals of said integrated circuit chips; and
    a thick film substrate laminated together with said thin film substrate and including a second signal wiring layer therein, said second signal wiring layer including a signal wiring for electrically interconnecting signal terminals of said integrated circuit chips.

2. A thick film and thin film composite substrate according to claim 1, wherein through-holes included in said thick film substrate and connected to the signal wiring included in said second signal wiring layer are electrically connected to through-holes included in said thin film substrate.

3. A thick film and thin film composite wiring substrate according to claim 1, wherein said thin film wiring substrate comprises an organic insulation material as the insulation material thereof.

4. A thick film and thin film composite wiring substrate according to claim 1, wherein said thick film wiring substrate comprises ceramic as insulation material thereof.

5. A thick film and thin film composite wiring substrate according to claim 1, wherein the second signal wiring layer comprises a signal wiring for supplying a clock signal to said integrated circuit chips. signal wiring for supplying clock.

6. A thick film and thin film composite wiring substrate according to claim 1, wherein the signal wiring layer included in said thick film substrate comprises signal wiring for test and maintenance of integrated circuit chips mounted on said thick film and thin film composite substrate.

7. A thick film and thin film composite wiring substrate according to claim 1, further comprising a wiring layer exclusively used for connecting through-holes included in said thin film wiring substrate with through-holes included in said thick film substrate, said wiring layer for exclusive use being disposed between said thin film wiring substrate and said thick film wiring substrate.

8. A thick film and thin film composite wiring substrate according to claim 7, wherein said wiring layer for exclusive use comprises a signal wiring layer included in said thin film substrate.

9. A thick film and thin film composite wiring substrate according to claim 8, wherein said wiring layer for exclusive use has a characteristic impedance which differs from a characteristic impedance of signal wiring included in other signal wiring layers of said thin film substrate.

10. A thick film and thin film composite wiring substrate according to claim 1, wherein the number of through-holes included in said thin film substrate is larger than the number of through-holes included in said thick film substrate.

11. A thick film and thin film composite wiring substrate according to claim 1, wherein signal wiring disposed in the signal wiring layers included in said thin film substrate comprises signal wiring carrying such signals that propagation time within the signal wiring layers affects the response speed of a logic circuit comprising integrated circuit chips mounted on said thick film and thin film composite substrate.

12. A thick film and thin film composite wiring substrate according to claim 7, wherein a signal path extending from an integrated circuit chip to a through-hole included in said thick film substrate comprises:
    a signal spread layer for leading the signal from said integrated circuit chip to a test pad located around said integrated circuit chip on the surface of said thin film substrate;
    a through-hole located right under said test pad and connected to said test pad; and
    said wiring layer for exclusive use connecting said through-hole and a through-hole included in said thick film substrate, and
    wherein at least a part of through-holes included in said thick film wiring layer is located right under said integrated circuit chip.

13. A thick film and thin film composite wiring substrate according to claim 7, wherein said wiring layer for exclusive use comprises wiring for connecting signals between said thin film substrate and said thick film substrate and wiring for power supply connection in an identical wiring layer.

14. A thick film and thin film composite wiring substrate according to claim 13, wherein wiring width of the wiring for power supply connection is wider than that of the wiring for transmitting signals therethrough.

15. A thick film and thin film composite wiring substrate according to claim 2, wherein through-holes included in said thin film wiring substrate are directly connected to through-holes included in said thick film wiring substrate.

16. A thick film and thin film composite wiring substrate according to claim 15, wherein said through-holes of said thin film substrate and said thick film substrate are arranged in lattice form, and lattice pitch of the through-holes of said thick film substrate is equivalent to an integer times that of the through-holes of said thin film substrate.

17. A thick film and thin film composite wiring substrate according to claim 1, wherein each signal wiring included in said thin film substrate is so dimensioned with respect to a cross section thereof that the DC resistance value of signal wiring within said thin film substrate having the greatest length may not exceed one tenth of the characteristic impedance value thereof.

18. A thick film and thin film composite wiring substrate according to claim 1, wherein each signal wiring layer included in said thin film substrate comprises two layers, i.e., a normal signal wiring layer and a test signal wiring layer.

19. A thick film and thin film composite wiring substrate according to claim 1, wherein the characteristic impedance of the signal wiring included in said second signal wiring layer is set at the same value as that of characteristic impedance of the signal wiring included in said first signal wiring layer.

20. A thick film and thin film composite wiring substrate according to claim 1, further comprising:
    a test pad formed on the surface of said thin film substrate;
    a wiring layer for connecting said test pad to an integrated circuit chip mounted on the surface of said thin film substrate;
    a resistor element disposed right under said test pad; and
    a partially-through-hole for connecting said resistor element to said test pad.

21. A thick film and thin film composite wiring substrate according to claim 1, further comprising:
    a test pad formed on the surface of said thin film substrate;
    a signal spread wiring layer including a wiring for connecting said test pad to an integrated circuit chip mounted on the surface of said thin film substrate;
    a resistor element disposed in an area between said test pad and said integrated circuit chip, and under said signal spread wiring layer; and
    a wiring layer including a wiring for connecting said resistor element to said test pad.

22. A thick film and thin film composite wiring substrate according to claim 1, wherein a plurality of through-holes included in said thick film substrate are connected to a pad included in pads so disposed on the surface of said thick film substrate as to fix input and output pins and connected to an input pin for power supply, and one through-hole included in said thick film substrate is connected to a pad included in the pads so disposed on the surface of said thick film substrate as to fix input and output pins and connected to an input/output pin for signal supply.

23. A thick film and thin film composite wiring substrate for mounting integrated circuit chips thereon, comprising:
    a thick film substrate including a signal wiring layer therein; and
    a thin film substrate including a signal wiring layer therein, said thin film substrate being formed above said thick film substrate,
    wherein the signal wiring layer included in said thin film substrate is cross sectionally dimensioned so that a resulting DC resistance of the longest signal wiring thereof and included in said thin film substrate is equivalent to one tenth or less of characteristic impedance value of said signal wiring.

24. A thick film and thin film composite wiring substrate for mounting integrated circuit chips thereon, comprising:
   a thick film substrate including a signal wiring layer therein;
   a thin film substrate including a signal wiring layer therein, said thin film substrate being formed above said thick film substrate; and
   the signal wiring layer included in said thin film substrate comprising a signal wiring layer for testing.

25. A thick film and thin film composite wiring substrate for mounting integrated circuit chips thereon, comprising:
   a thick film substrate including a signal wiring layer therein;
   a thin film substrate including a signal wiring layer therein, said thin film substrate being formed above said thick film substrate; and
   through-holes included in said thin film substrate being arranged in a lattice form with a pitch equivalent to the lattice pitch of said thin film substrate.

26. A thick film and thin film composite wiring substrate for mounting integrated circuit chips thereon, wherein the characteristic impedance of a signal wiring in a thin film is made substantially equal to that of a signal wiring in a thick film.

27. A thick film and thin film composite wiring substrate for mounting integrated circuit chips thereon, comprising:
   a thick film substrate including a signal wiring layer therein;
   a thin film substrate including a signal wiring layer therein, said thin film substrate being formed above said thick film substrate; and
   a resistor element for terminating said integrated circuit chip, said resistor element being disposed under a test pad on the surface of said thin film substrate, said resistor element being connectable to said test pad via a partially-through-hole.

28. A thick film and thin film composite wiring substrate according to claim 27, wherein a power supply layer for feeding power to said resistor element is not present right under a boundary portion between said integrated circuit chip and said test pad.

29. A thick film and thin film composite wiring substrate for mounting integrated circuit chips thereon, comprising:
   a thick film substrate including a signal wiring layer therein;
   a thin film substrate including a signal wiring layer therein, said thin film substrate being formed above said thick film substrate;
   a resistor element for terminating said integrated circuit chip, said resistor element being disposed in an area between a test pad and an integrated circuit chip on the surface of said thin film substrate; and
   a wiring layer used exclusively for forming wiring connecting said resistor element to said test pad.

30. A thick film and thin film composite wiring substrate for mounting integrated circuit chips thereon, comprising:
   a thick film substrate including a signal wiring layer therein;
   a thin film substrate including a signal wiring layer therein, said thin film substrate being formed above said thick film substrate;
   a pad disposed on the back of said thick film substrate for connection with a power supply pin;
   a plurality of through-holes included in said thick film substrate being connected to said pad;
   another pad disposed on the back of said thick film substrate for connection with a signal input/out pin; and
   one through-hole included in said thick film substrate being connected to said another pad.

31. An electronic circuit apparatus comprising:
   a wiring substrate for mounting a plurality of integrated circuit chips or integrated circuit packages and for electrically interconnecting said integrated circuit chips or integrated circuit packages;
   pins or connectors for inputting/outputting signals from/to the outside;
   said wiring substrate comprising a thick film substrate including a signal wiring layer therein and a thin film substrate including a signal wiring layer therein, said thin film substrate being formed above said thick film substrate; and
   at least a part of signal wiring carrying electric signals having no relation to response speed of said electronic circuit apparatus being disposed in signal wiring layers included in said thick film substrate.

32. An electronic circuit apparatus according to claim 31, wherein internal circuits of said integrated circuits or integrated circuit chip packages comprise ECL circuits.

* * * * *